(12) United States Patent
Nishikawa et al.

(10) Patent No.: US 8,921,846 B2
(45) Date of Patent: Dec. 30, 2014

(54) ORGANIC EL DEVICE AND METHOD FOR PRODUCING ORGANIC EL DEVICE

(75) Inventors: Akira Nishikawa, Kamikita-gun (JP); Shigeru Ayukawa, Tokyo (JP); Hideo Yamagishi, Kamikita-gun (JP)

(73) Assignee: Kaneka Corporation, Osaka-shi (JP)

(*) Notice: Subject to any disclaimer, the term of this patent is extended or adjusted under 35 U.S.C. 154(b) by 0 days.

(21) Appl. No.: 13/978,387

(22) PCT Filed: Jan. 4, 2012

(86) PCT No.: PCT/JP2012/050024
§ 371 (c)(1),
(2), (4) Date: Jul. 3, 2013

(87) PCT Pub. No.: WO2012/093671
PCT Pub. Date: Jul. 12, 2012

(65) Prior Publication Data
US 2013/0285033 A1    Oct. 31, 2013

(30) Foreign Application Priority Data
Jan. 7, 2011   (JP) .................................. 2011-002473

(51) Int. Cl.
| | | |
|---|---|---|
| H01L 35/24 | (2006.01) | |
| H01L 51/00 | (2006.01) | |
| H01L 51/50 | (2006.01) | |
| H01L 27/32 | (2006.01) | |
| H05B 33/08 | (2006.01) | |

(52) U.S. Cl.
CPC ........ *H01L 51/5012* (2013.01); *H01L 27/3204* (2013.01); *H01L 27/3202* (2013.01); *H05B 33/0821* (2013.01); *H01L 2251/564* (2013.01)
USPC ................... 257/40; 257/44; 257/47; 438/35; 438/42

(58) Field of Classification Search
USPC .............................. 257/40, 44, 47; 438/35, 42
See application file for complete search history.

(56) References Cited

U.S. PATENT DOCUMENTS

| | | | | |
|---|---|---|---|---|
| 7,034,470 B2* | 4/2006 | Cok et al. | ....................... | 315/249 |
| 7,198,533 B2* | 4/2007 | Duggal et al. | ................... | 445/24 |

(Continued)

FOREIGN PATENT DOCUMENTS

| | | | |
|---|---|---|---|
| JP | 341390 U | 4/1991 | |
| JP | 05198843 A | 8/1993 | |

(Continued)

OTHER PUBLICATIONS

International Bureau of WIPO, International Preliminary Report on Patentability of PCT/JP2012/050024, Jul. 10, 2013, Switzerland, 10 pages.

(Continued)

*Primary Examiner* — Phuc Dang
(74) *Attorney, Agent, or Firm* — Alleman Hall McCoy Russell & Tuttle LLP

(57) ABSTRACT

The present invention aims at providing an organic EL device that emits light by an alternating current, has a simple structure and provides little increase of production processes, while downsizing an overall configuration and a simplifying a method for producing said organic EL device. The organic EL device includes a power feeding part and an organic-EL-element forming part. The organic-EL-element forming part includes a plurality of unit EL elements formed on a substrate. There is provided a plurality of series-connected parts each formed by a plurality of the unit EL elements that are electrically connected in series in a forward direction. A plurality of the series-connected parts are electrically connected to the power feeding part in parallel. The series-connected parts that are connected in parallel include a series-connected part that is connected to the power feeding part so as to have a reverse polarity.

15 Claims, 12 Drawing Sheets

(56) References Cited

U.S. PATENT DOCUMENTS

| | | | |
|---|---|---|---|
| 8,097,889 B2 * | 1/2012 | Sakai et al. | 257/88 |
| 8,487,530 B2 * | 7/2013 | Nomura | 313/506 |
| 2004/0032220 A1 | 2/2004 | Cok et al. | |
| 2006/0158130 A1 | 7/2006 | Furukawa | |

FOREIGN PATENT DOCUMENTS

| | | | |
|---|---|---|---|
| JP | 2000029404 A | 1/2000 | |
| JP | 2004134385 A | 4/2004 | |
| JP | 2005149744 A | 6/2005 | |
| JP | 2006179672 A | 7/2006 | |
| JP | 2007122983 A | 5/2007 | |
| JP | 2009295487 A | 12/2009 | |

OTHER PUBLICATIONS

Japanese Patent Office, International Search Report of PCT/JP2012/050024, Apr. 17, 2012, WIPO, 2 pages.

* cited by examiner

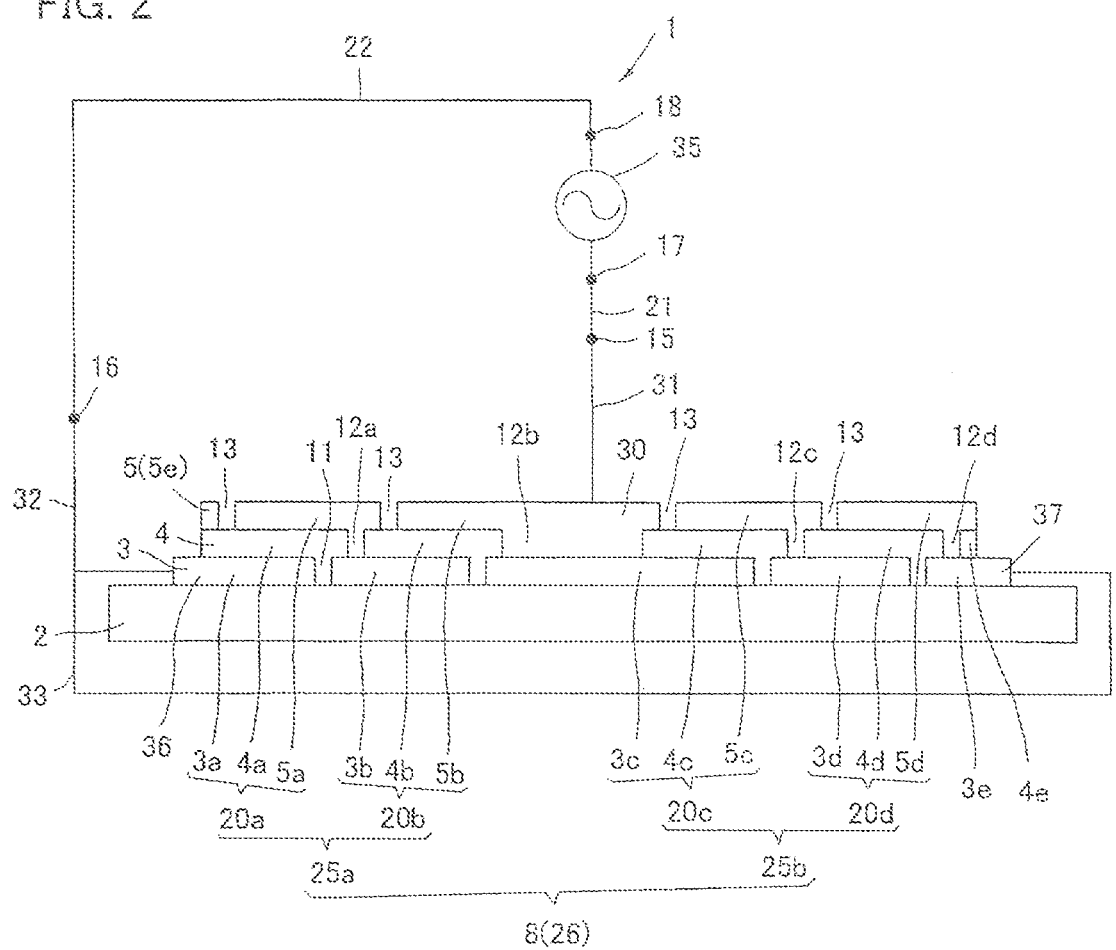

------- GROOVE FOR DIVIDING FRONT ELECTRODE LAYER
(FIRST SEPARATION GROOVE AND BUFFER GROOVE)
------- EMISSION-LAYER SEPARATION GROOVE
------- SECOND SEPARATION GROOVE

ORGANIC EL DEVICE AND METHOD FOR PRODUCING ORGANIC EL DEVICE

TECHNICAL FIELD

The present invention relates to an organic EL device and a method for producing an organic EL device. Specifically, the present invention relates to an organic EL device that uses an alternating current to emit light and achieves a simplification of said device.

BACKGROUND ART

Organic EL (Electro Luminescence) devices are attracting attention as lighting equipment of future generations, and have been much studied.

An organic EL device is formed by laminating organic EL elements composed of substances such as organic compounds on a substrate such as a glass substrate or a transparent resin film. An organic EL element is a light emitting element that has an organic emission layer provided between an anode and a cathode. An organic emission layer is composed of layers such as a hole injection layer, a hole transport layer, an emission layer, an electron transport layer, and an electron injection layer.

An organic EL device is intrinsically a device that emits light upon application of a DC voltage. Specifically, an organic EL element has a junction of a p-doped semiconductor with an n-doped semiconductor, so that it is a device having a diode characteristic. Therefore, an organic EL element has polarities as described above and emits light only when power is supplied so that a p-doped semiconductor has a plus pole and an n-doped semiconductor has a minus pole and does not emit light in the contrary case. Consequently, when a commercial AC voltage is applied to organic EL elements, the organic EL elements light up at a half cycle of a forward voltage and black out at the other half cycle of a backward voltage, which may cause a perceptible flicker (blinking) in our eyes.

Thus, there would exist such a configuration in which a rectification circuit is added to an organic EL device. A patent document 1 specified below discloses an organic EL lighting equipment (hereinafter simply referred to as an organic EL device) provided with a rectification circuit. Though the organic EL device described in the patent document 1 uses an AC source as an external power source, it prevents a flicker (blinking) by a full-wave rectification in the rectification circuit. Further, an integral provision of the rectification circuit with organic EL elements is described as a realizable downsizing of the organic EL device.

PATENT DOCUMENT

Patent Document 1: JP 2009-295487 A

DISCLOSURE OF INVENTION

Technical Problem

However, in the organic EL device disclosed in the patent document 1, the rectification circuit is an indispensable configuration, which inevitably results in a complicated structure. That causes a sense of dissatisfaction that production processes would be excessively increased. Specifically, while the organic EL elements of the organic EL device are produced by depositing predetermined layers on a glass substrate, the rectification circuit is produced by another production process. That excessively increases the production processes. Additionally, the organic EL device disclosed in the patent document 1 requires a means to mount the rectification circuit, resulting in a complicated structure. Furthermore, since the rectification circuit is an indispensable component in the organic EL device disclosed in the patent document 1, it is necessary to secure an installation position for the rectification circuit separately from that for the organic EL elements, which physically has a limitation to downsize the organic EL device.

In view of the above-mentioned problems and drawbacks, the present invention therefore aims at providing an organic EL device that emits light by an alternating current, has a simple structure and provides little increase of production processes, and downsizes an overall configuration and simplifies a method for producing said organic EL device.

Solution to Problem

An aspect of the present invention to solve the above-mentioned problems and drawbacks is an organic EL device including a power feeding part and an organic-EL-element forming part, wherein the organic-EL-element forming part includes a plurality of unit EL elements formed on a substrate, and wherein the organic-EL-element forming part is constituted by a plurality of series-connected parts each formed by a plurality of the unit EL elements that are electrically connected in series in a forward direction, the series-connected parts being electrically connected to the power feeding part in parallel, and the series-connected parts including a series-connected part that is connected to the power feeding part so as to have a reverse polarity.

In this aspect, the series-connected parts each formed by the unit EL elements are electrically connected to the power feeding part in parallel and the series-connected parts connected in parallel includes one connected to the power feeding part so as to have a reverse polarity. In sum, there are provided the series-connected parts electrically connected in inverse parallel that allows a plurality of the series-connected parts to alternately light by an AC voltage, thereby substantially preventing flickering (blinking) In other words, even application of an AC voltage to a plurality of series-connected parts without rectification emits light with a flicker small enough to be substantially ignored, so that a separate rectification circuit may be dispensed with.

Therefore, the organic EL device of this aspect has a simple structure and little increase of production processes, and downsizes an overall configuration of said organic EL device.

A specific embodiment of the present aspect has a unit EL element row formed by a plurality of the unit EL elements that are apparently connected in series, the unit EL element row being divided into a plurality of the series-connected parts, and the series-connected parts being electrically connected to the power feeding part in parallel.

The organic EL device of this configuration has the unit EL element row formed by a plurality of the unit EL elements that are apparently connected in series. Herein, the term "that are apparently connected in series" means to have a configuration including a single unit EL element row electrically connected in series. In the organic EL device of this configuration, a single "unit EL element row" electrically connected in series is formed and electrically divided, so that the divided parts function as the respective "series-connected parts."

It is recommended that, in the organic EL device, the unit EL element row receives electric power through a center of the unit EL element row and through both sides of the unit EL element row.

Herein, the "center" means a part except end portions and is not limited to a central point. In this configuration, the unit EL element row constituted by a plurality of the serially connected unit EL elements receives electric power through the center and through both sides, so as to be electrically divided into two. Herein, each of the electrically divided parts also includes a plurality of the unit EL elements, which are connected in series, so as to meet the configuration requirements for the "series-connected part." Further, in the present aspect, the series-connected parts formed by being divided are connected in inverse parallel. In this aspect, one side and the center of the unit EL elements constitute, for example, the series-connected part in a forward direction, whereas the other side and the center of the unit EL elements constitute, for example, the series-connected part in a reverse direction. Hence, the series-connected parts at both sides with the boundary of the center alternately have a forward electric current by application of an alternating current, so that the series-connected parts at both sides with the boundary of the center alternately emit light. In this way, this aspect has an excellent versatility since the unit EL element row formed on a single substrate can be divided at one's discretion only by provision of the power feeding part at a predetermined position.

Further, the organic EL device may have a plurality of unit EL element rows each formed by a plurality of the unit EL elements that are apparently connected in series, each of the unit EL element rows functioning as a single series-connected part and being electrically connected to the power feeding part in parallel.

The organic EL device of this configuration makes a single unit EL element row function as a single series-connected part.

Alternatively, the present invention may be an organic EL device combining the above-mentioned configurations. The combined organic EL device has a plurality of unit EL element rows each formed by a plurality of the unit EL elements that are apparently connected in series, the unit EL element rows including at least one row that is divided into a plurality of the series-connected parts, the unit EL element rows further including at least another row that forms a single series-connected part, and the series-connected parts each being electrically connected to the power feeding part in parallel.

The organic EL device of this configuration includes a part where one unit EL element row is divided into a plurality of the series-connected parts and another part where one unit EL element row functions as one series-connected part.

Further, in the organic EL device, it is recommended that, a unit EL element belonging to one of the series-connected parts and another unit EL element belonging to another of the series-connected parts are connected in parallel, so as to form a bridge circuit.

In a case where a plurality of unit EL elements are connected in series, electrical charge may be accumulated in the unit EL elements, resulting in reduced life of the elements. In the "bridge circuit" employed in the organic EL device of this configuration, a unit EL element belonging to one of the series-connected parts and another unit EL element belonging to another of the series-connected parts are connected in parallel. In other words, in a pair of the unit EL element rows, the unit EL elements are connected in parallel, so as to have opposite polarities.

Hence, when a forward voltage is applied to one unit EL element, a reverse bias is applied to the other unit EL element. Specifically, a reverse bias can be separately applied to a unit EL element located in the center of the series-connected part, thereby preventing electrical charge from being accumulated in each unit EL element.

Herein, application of a reverse bias means to apply a voltage to a PN junction intrinsically contained in a unit EL element in a direction opposite thereto. In sum, a voltage is applied so that a P side becomes negative and an N side becomes positive.

The organic EL device of this configuration provides longer life of unit EL elements.

Alternatively, it is recommended that the unit EL elements each have a part functioning as an anode and a part functioning as a cathode, and at least one pair selected from the group consisting of (1) a pair of the parts that function as the anodes and (2) a pair of the parts that function as the cathodes being electrically connected to each other between a unit EL element belonging to one of the series-connected parts and another unit EL element belonging to another of the series-connected parts among the series-connected parts connected in parallel.

According to this configuration, a reverse bias is applied to the unit EL elements.

Alternatively, it is recommended that the organic EL device includes at least a first electrode layer, an organic emission layer, and a second electrode layer that are laminated on the substrate, and further has first separation grooves dividing the first electrode layer into a plurality of small pieces, emission-layer separation grooves dividing the organic emission layer into a plurality of small emitting areas, and second separation grooves dividing the second electrode layer into a plurality of small pieces, so that the unit EL elements each are constituted by one of the small pieces of the first electrode layer, one of the small emitting areas, and one of the small pieces of the second electrode layer.

The "unit EL element constituted by one of the small pieces of the first electrode layer, one of the small emitting areas, and one of the small pieces of the second electrode layer" employed in this configuration is defined by the first separation groove, the emission-layer groove, and the second separation groove. In sum, only by dividing a piece of substrate by such a configuration as readily-processable "grooves," are a plurality of unit EL elements formed, which achieves an excellent productivity.

In the organic EL device, it is recommended that a part of the small piece of the second electrode layer belonging to at least one of the unit EL elements extends and is connected to the small piece of the first electrode layer belonging to another of the unit EL elements.

Herein, the term "a part of the small piece of the second electrode layer belonging to at least one of the unit EL elements extends and is connected to the small piece of the first electrode layer belonging to another of the unit EL elements" means that the first separation groove is filled with a conductive material constituting the second electrode layer. This configuration forms a unit EL element row in which the unit EL elements are connected in series. Thus, the unit EL element row is formed only by filling the first separation groove at the same time when the second electrode layer is laminated without separate preparation of another conductive material for connection. That achieves an excellent productivity.

In the organic EL device, it is recommended that the series-connected part is constituted by electrically and sequentially connecting adjacent unit EL elements in series in a forward direction in such a manner that a part of the small piece of the second electrode layer belonging to a unit EL element extends to the small piece of the first electrode layer belonging to its adjacent EL element, a plurality of the series-connected parts being arranged on the substrate in parallel, the adjacent series-connected parts having opposing electrical forward directions to the substrate in a planar view of the substrate, and the small pieces of the second electrodes belonging to the unit EL elements of adjacent series-connected parts being electrically connected to each other.

This configuration applies a reverse bias to the unit EL elements.

It is desirable that the organic EL device includes at least two rows of the first electrode layers formed on the substrate and electrically insulated from each other, the organic emission layer and the second electrode layer are laminated on each row of the first electrode layers, wherein each row of the first electrode layers is divided into a plurality of small pieces by the first separation grooves, the organic emission layer is divided into a plurality of small emitting areas by the emission-layer separation grooves, and the second electrode layer is divided into a plurality of small pieces by the second separation grooves, the small pieces of the second electrode layer being electrically connected to the small pieces of the second electrode layer that is laminated on the first electrode layer belonging to the adjacent row.

This configuration applies a reverse bias to the unit EL elements.

It is recommended that the second electrode layer is laminated on an area that bridges over more than one row of the first electrode layers, over which the second separation grooves extend, so that the second separation grooves divide the second electrode layer into a plurality of divided areas, and each of the divided areas including the single small piece of the second electrode layer that includes the first electrode layer belonging to one row and the single small piece of the second electrode layer that includes the first electrode layer belonging to its adjacent row.

This configuration applies a reverse bias to the unit EL elements.

The second separation grooves each are desirably constituted by straight lines located at shifted positions and a line connecting the straight lines.

Another aspect of the present invention is a method for producing any of the organic EL devices as described above, including a step of forming the first separation grooves, the emission-layer grooves, and the second separation grooves by irradiation of a laser beam.

Generally, when a semiconductor device is formed on a substrate, a method using a metal mask in which a desired circuit is perforated for masking the substrate so as to deposit desired materials is employed. However, a unit EL element on which a plurality of layers are laminated requires metal masks by the number of layers, resulting in increased cost. Further, another problem is a bothersome positioning of the substrate and the metal mask.

The method for producing the organic EL device in this aspect forms desired unit EL elements and unit EL element row only by laminating the first electrode layer, the organic emission layer, and the second electrode layer on the substrate and scribing of unnecessary parts of each layer by a laser beam so as to form the above-mentioned grooves. Consequently, a metal mask required conventionally is not needed.

Advantageous Effect of Invention

The organic EL device and the method for producing the organic EL device of the present invention provides little increase of production processes and simplifies a whole configuration of the organic EL device, so as to downsize the device.

BRIEF DESCRIPTION OF DRAWINGS

FIG. 2 is a front cross section of the organic EL device in FIG. 1;

DESCRIPTION OF EMBODIMENTS

Now, an organic EL device and a method for producing an organic EL device of an embodiment of the present invention will be described in detail below, making reference to the figures. Herein, the description below is utilized to facilitate understanding of embodiments and the present invention should not be understood with limited by that.

Figure 1:
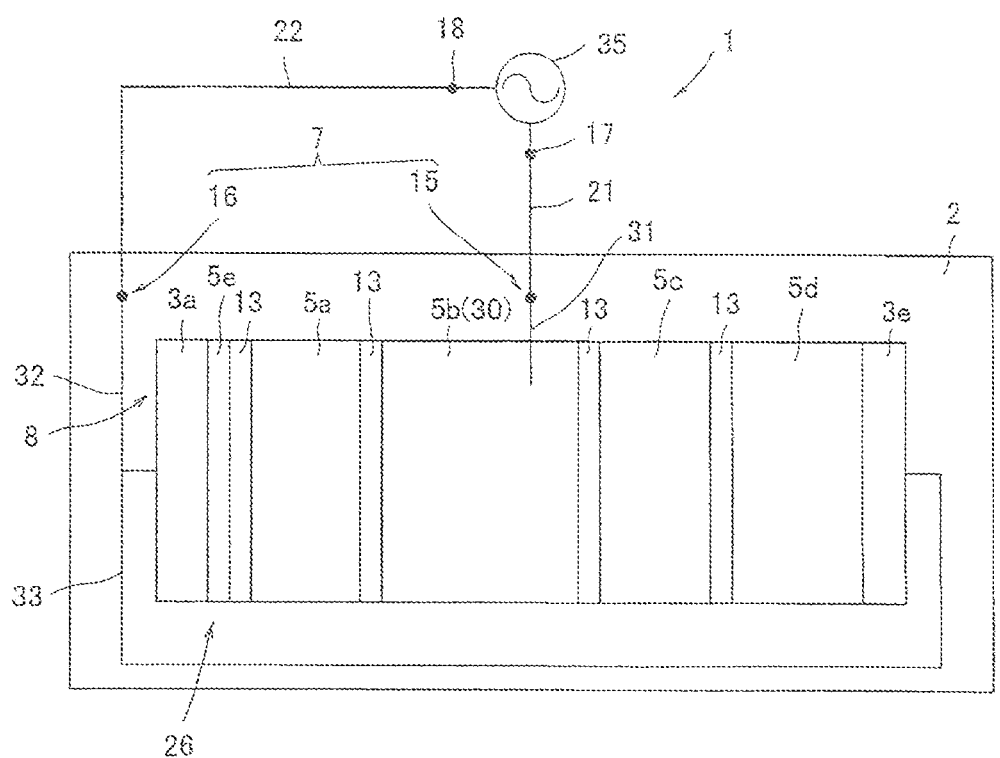
FIG. 1 is a plan view of an organic EL device of an embodiment of the present invention, which is conceptually illustrated.

An organic EL device 1 shown in FIGS. 1 and 2 is constituted in such a manner that a power feeding part 7 and an organic-EL-element forming part 8 formed on a glass substrate (base material) 2.

The organic-EL-element forming part 8 is, as shown in FIG. 2, a part where a front electrode layer 3, which is a first electrode layer (anode), an organic emission layer 4, and a back electrode layer 5, which is a second electrode layer (cathode), are laminated in order.

The front electrode layer 3 is constituted by a known transparent conductive film such as ITO (Indium oxide) or ZnO (Zinc oxide). The front electrode layer 3 has a plurality of first separation grooves 11, which divide the front electrode layer 3 into front electrode pieces 3a to 3e. In each of the first separation grooves 11, a part of the organic emission layer 4 penetrates.

The front electrode pieces 3a and 3e located at both ends among the front electrode pieces 3a to 3e function as end-side power supply parts 36 and 37, respectively. The front electrode pieces 3b to 3d function as anode-side electrodes of a unit EL element.

The organic emission layer 4 is a known emission layer composed of layers such as a hole injection layer, a hole transport layer, an emission layer, an electron transport layer, and an electron injection layer. The organic emission layer 4 has a plurality of emission-layer separation grooves 12, which divide the organic emission layer 4 into small emitting areas 4a to 4e. In each of the emission-layer separation grooves 12, a part of the back electrode layer 5 penetrates.

The back electrode layer 5 is constituted by a known conductive metal. The back electrode layer 5 has a plurality of second separation grooves 13, which divide the back electrode layer 5 into back electrode pieces 5a to 5e. The back electrode pieces 5a to 5e function as cathode-side electrodes of the unit EL element.

Herein, the back electrode piece 5b is positioned roughly in the center of the back electrode layer 5. The back electrode piece 5b bridges over the small emitting areas 4b and 4c. Further, the back electrode piece 5b positioned roughly in the center is wider than the other back electrode pieces 5a, 5c, and 5d. In this embodiment, the back electrode piece 5b constitutes a center power supply part 30.

As described above, the front electrode layer 3, the organic emission layer 4, and the back electrode layer 5 are respectively divided by the first separation grooves 11, the emission-layer separation grooves 12, and the second separation grooves 13 into the front electrode pieces 3a to 3e, the small emitting areas 4a to 4e, and the back electrode pieces 5a to 5e.

The front electrode piece 3a, the small emitting area 4a, and the back electrode piece 5a constitute a first unit EL element 20a, which is a light emitting element having polarities. Specifically, the first unit EL element 20a emits light upon power distribution in a direction with the front electrode piece 3a as an anode and the back electrode piece 5a as a cathode and blacks out upon power distribution in the opposite direction.

Similarly, the front electrode piece 3b, the small emitting area 4b, and the back electrode piece 5b constitute a second unit EL element 20b. The second unit EL element 20b emits light upon power distribution in a direction with the front electrode pieces 3b as an anode and the back electrode piece 5b as a cathode and blacks out upon power distribution in the opposite direction.

Similarly, the front electrode piece 3c, the small emitting area 4c, and the back electrode piece 5c constitute a third unit EL element 20c, whereas the front electrode piece 3d, the small emitting area 4d and the back electrode piece 5d constitute a fourth unit EL element 20d. The third unit EL element 20c and the fourth unit EL element 20d also respectively emit light upon power distribution in directions with the front electrode pieces 3c and 3d as anodes and the back electrode pieces 5c and 5d as cathodes and black out upon power distribution in the opposite directions.

The first unit EL element 20a through the fourth unit EL element 20d are sequentially juxtaposed and constitute a unit EL element row 26.

The back electrode piece 5a, which is the cathode of the first unit EL element 20a, is connected via the emission-layer separation groove 12a to the front electrode piece 3b (first electrode layer) of the adjacent second unit EL element 20b. Specifically, the back electrode piece 5a, which is the cathode of the first unit EL element 20a, is connected to the front electrode piece 3b, which is the anode of the second unit EL element 20b. Hence, the first unit EL element 20a and the second unit EL element 20b are serially connected. The first unit EL element 20a and the second unit EL element 20b form a first series-connected part 25a.

On the other hand, as to the right side in the figure of the organic EL device 1, the back electrode piece 5c, which is the cathode of the third unit EL element 20c, is connected to the front electrode piece 3d, which is the anode of the fourth unit EL element 20d. Hence, the third unit EL element 20c and the fourth unit EL element 20d are serially connected. The third unit EL element 20c and the fourth unit EL element 20d form a second series-connected part 25b.

The back electrode piece 5d, which is the cathode of the fourth unit EL element 20d, is connected to the front electrode piece 3e, which is an end of the front electrode layer.

The back electrode piece 5b positioned in the center, as described above, functions as the cathode of the second unit EL element 20b and is further electrically connected to the front electrode piece 3c, which is the anode of the adjacent third unit EL element 20c.

In this embodiment, as described above, since the back electrode piece 5b, which is the cathode of the second unit EL element 20b, is electrically connected to the front electrode piece 3c, which is the anode of the third unit EL element 20c, the unit EL element row 26 is separately constituted by the four unit EL elements 20a, 20b, 20c, and 20d from the first unit EL element 20a through the fourth unit EL element 20d that are serially connected. In other words, the unit EL element row 26 is formed by apparently connecting the four unit EL elements 20a, 20b, 20c, and 20d in series.

The glass substrate (base material) 2 further includes internal wirings 31, 32, and 33 connecting the power feeding part 7 with the organic-EL-element forming part 8.

Specifically, the glass substrate (base material) 2 has two power feeding terminals 15 and 16, which constitute the power feeding part 7.

One terminal 15 of the power feeding part 7 is connected to the center power supply part 30 (the back electrode piece 5b of the second unit EL element 20b) positioned roughly in the center of the back electrode layer 5 via the internal wiring 31. Meanwhile, the other power feeding terminal 16 of the power feeding part 7 branches into the internal wirings 32 and 33, which are respectively connected to the end-side power supply parts 36 and 37 (the front electrode pieces 3a and 3e located at both ends) of the unit EL element row 26. In other words, the other power feeding terminal 16 of the power feeding part 7 is connected to the front electrode piece 3a, which is the anode of the first unit EL element 20a, and the front electrode piece 3e. Then, the front electrode piece 3e conducts with the cathode 5d of the fourth unit EL element 20d.

Now, an external wiring and an overall circuit structure of the organic EL device 1 will be described below.

The organic EL device 1, as shown in FIGS. 1 and 2, receives power supply from a power source unit 35. Herein, the power source unit 35 is an AC source and has two terminals 17 and 18 so as to generate an alternating current between the terminals. One terminal 17 of the power source unit 35 is connected to the power feeding terminal 15 of the organic EL device 1 via the external wiring 21.

Meanwhile, the other terminal 18 of the power source unit 35 is connected to the power feeding terminal 16 of the organic EL device 1 via the external wiring 22.

Figure 3A:
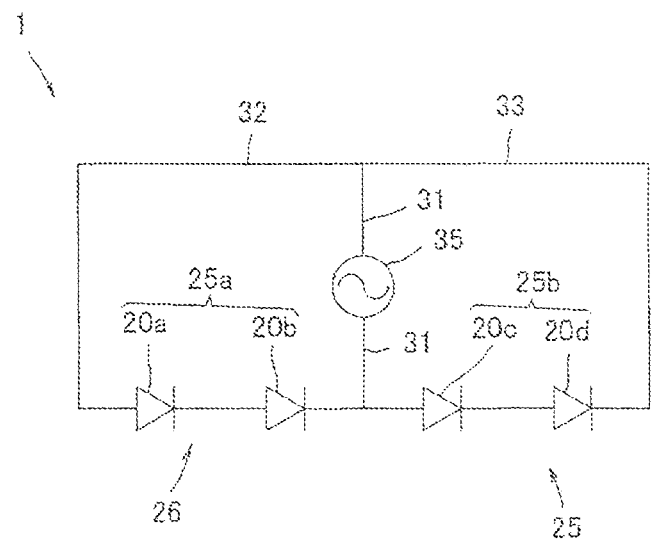
FIGS. 3A and 3B are electrical diagrams showing the organic EL device in FIG. 1, FIG. 3A being a layout of every element and FIG. 3B being an equivalent circuit of FIG. 3A.
Figure 3B:
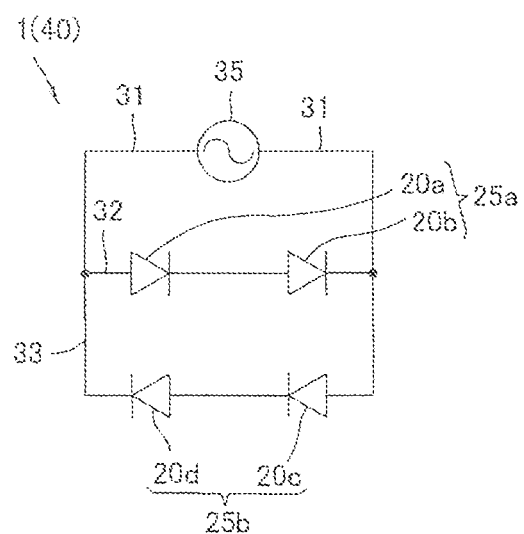

Hence, the organic EL device 1, including the power source unit 35 and the external wirings 21 and 22, can be expressed in circuit symbols shown in FIG. 3A. Further, the circuit shown in FIG. 3A can be expressed by an equivalent circuit shown in FIG. 3B. As shown in the equivalent circuit in FIG. 3B, the unit EL element row 26 is electrically divided into two series-connected parts 25a and 25b. The series-connected parts 25a and 25b are electrically connected in parallel, each having a different polarity from the other.

Now, an operating condition of the organic EL device 1 will be described below.

The power source unit 35 applies a desired alternating voltage. Upon application of a forward voltage to the first series-connected part 25a, the front electrode piece 3a of the first unit EL element 20a becomes a positive side, while the back electrode piece 5b of the second unit EL element 20b becomes a negative side. At this time, the front electrode piece 3a, which is the anode of the first unit EL element 20a, becomes a positive side, so that an electric current flows in the forward direction in the small emitting area 4a. Further, the electric current flows from the back electrode piece 5a of the first unit EL element 20a toward the front electrode piece 3b of the second unit EL element 20b, so that the electric current flows in the forward direction also in the small emitting area 4b of the second unit EL element 20b. Consequently, both the small emitting area 4a and the small emitting area 4b in the first series-connected part 25a emit light.

At this time, the adjacent series-connected part 25b blacks out because the front electrode piece 3c, which is the anode of the third unit EL element 20c, becomes a negative side and the back electrode piece 5d, which is the cathode of the fourth unit EL element 20d, becomes a positive side.

Then, when the current polarity of the power source unit 35 changes, the second series-connected part 25b previously having blacked out emits light, while the first series-connected part 25a previously having emitted light blacks out.

As described above, according to the organic EL device 1, the series-connected parts 25a and 25b alternately emit light by an AC voltage without using a rectification circuit conventionally having been required.

The organic EL device 1 of this embodiment of the present invention dispenses with a rectification circuit, thereby ensuring miniaturization.

Figure 4:
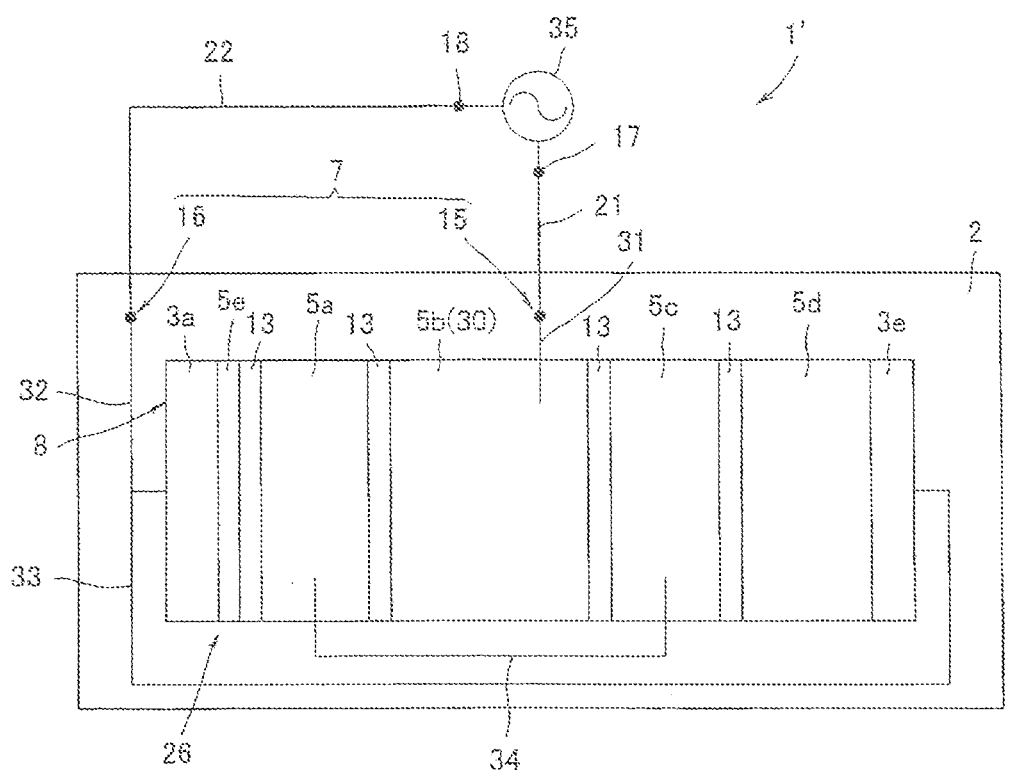
FIG. 4 is a plan view of an organic EL device of another embodiment of the present invention, which is conceptually illustrated.
Figure 5:
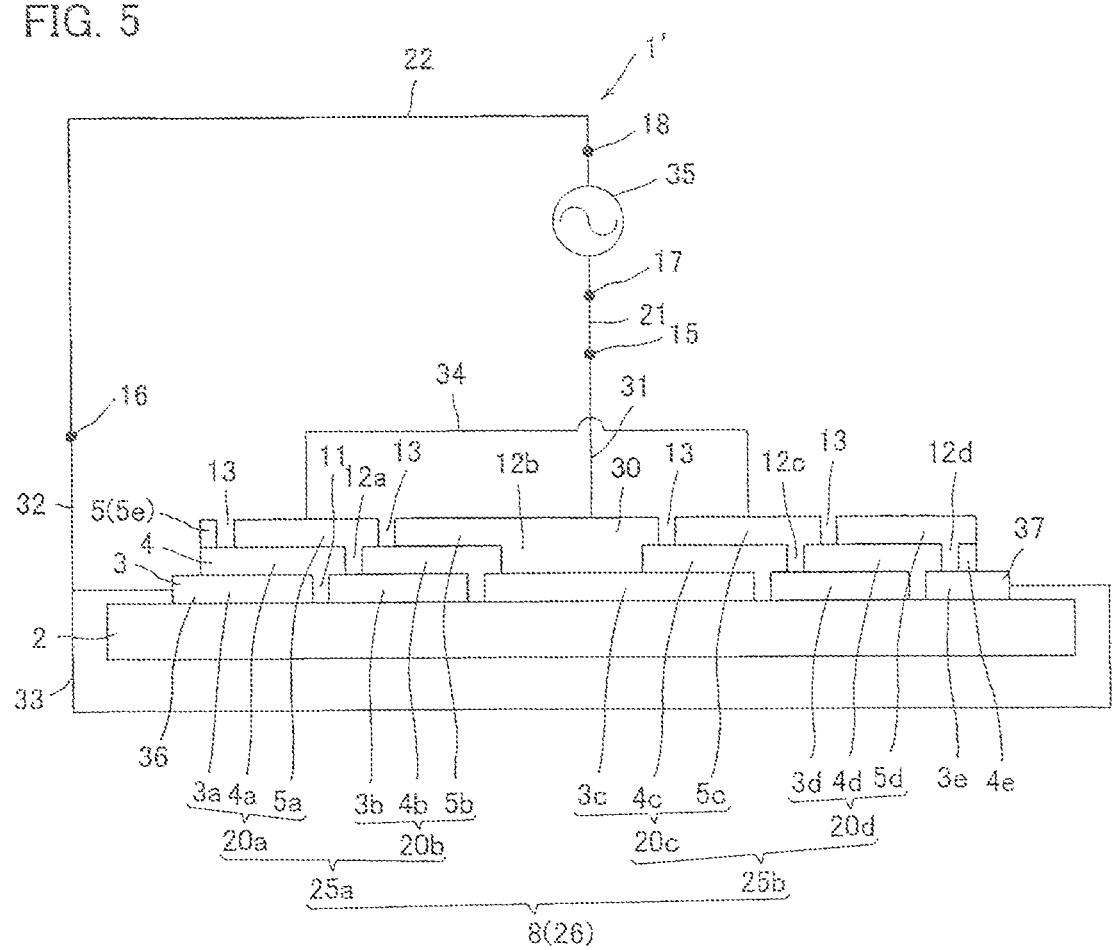
FIG. 5 is a front cross section of the organic EL device in FIG. 4.

Herein, as shown in FIGS. 4 and 5, addition of an internal wiring 34 to the above-mentioned organic EL device 1 gives the organic EL device 1 a longer life.

An organic EL device 1' of another embodiment of the present invention will be described in detail below, making reference to the figures. Herein, the same numerals are provided to the same components with the foregoing embodiment and the duplicated description will be omitted.

The organic EL device 1' as shown in FIGS. 4 and 5, the back electrode piece 5a, which is the cathode of the first unit EL element 20a, and the back electrode piece 5c, which is the cathode of the third unit EL element 20c, are connected to each other via the internal wiring 34.

Figure 6A:
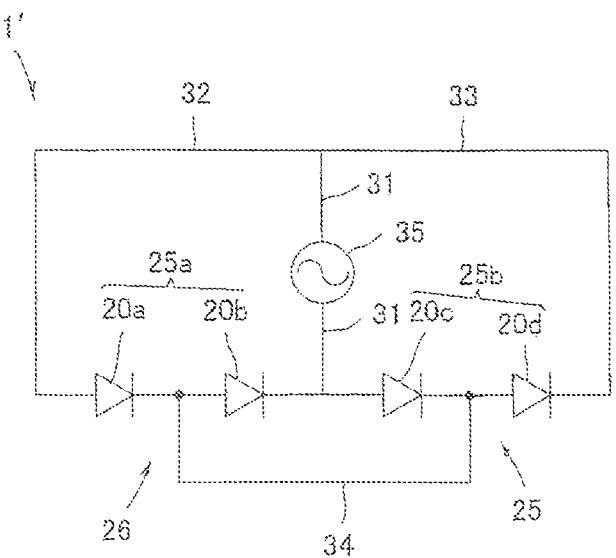
FIGS. 6A and 6B are electrical diagrams showing the organic EL device in FIG. 4, FIG. 6A being a layout of every element and FIG. 6B being a bridge circuit, which is an equivalent circuit of FIG. 6A.
Figure 6B:
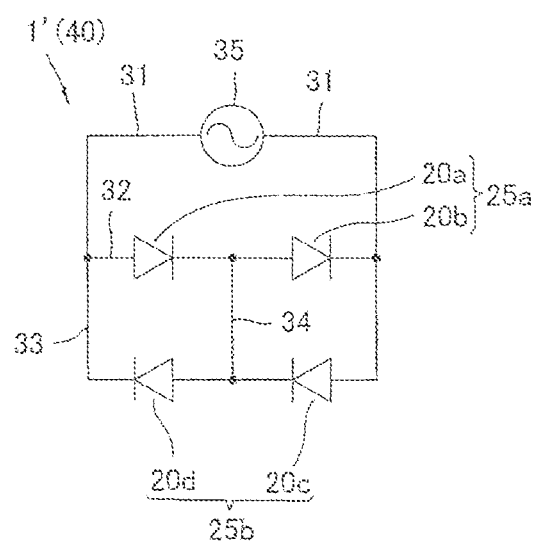

Hence, the organic EL device 1', including the power source unit 35 and the external wirings 21 and 22, can be expressed in circuit symbols shown in FIG. 6A. Further, the circuit shown in FIG. 6A can be expressed by an equivalent circuit shown in FIG. 6B. As shown in the equivalent circuit in FIG. 6B, the unit EL element row 26 is electrically divided into two series-connected parts 25a and 25b. The series-connected parts 25a and 25b are electrically connected in parallel, each having a different polarity from the other.

Further, the series-connected parts 25a and 25b are connected via a wiring 34, so that the unit EL elements 20a to 20d constitute a bridge circuit 40. Specifically, the unit EL element 20a and the unit EL element 20d are connected in parallel, each having a different polarity from the other. Similarly, the unit EL element 20b and the unit EL element 20c are connected in parallel, each having a different polarity from the other.

In this embodiment, application of an electric current to the bridge circuit 40 applies a forward voltage to the first series-connected part 25a, thereby applying a reverse bias (reverse voltage) to the other second series-connected part 25b. Specifically, upon application of the forward voltage to the first series-connected part 25a, the front electrode piece 3a of the first unit EL element 20a becomes a positive side, while the back electrode piece 5b of the second unit EL element 20b becomes a negative side. At this time, the front electrode piece 3a, which is the anode of the first unit EL element 20a, becomes a positive side, so that the electric current flows in the forward direction in the small emitting area 4a. Further, the electric current flows from the back electrode piece 5a of the first unit EL element 20a toward the front electrode piece 3b of the second unit EL element 20b, so that the electric current flows in the forward direction also in the small emitting area 4b of the second unit EL element 20b. Consequently, both the small emitting area 4a and the small emitting area 4b in the first series-connected part 25a emit light.

At this time, the adjacent series-connected part 25b blacks out because the front electrode piece 3c, which is the anode of the third unit EL element 20c becomes a negative side, and the back electrode piece 5d, which is the cathode of the fourth unit EL element 20d, becomes a positive side.

However, as described above, since the back electrode piece 5a, which is the cathode of the first unit EL element 20a, and the back electrode piece 5c, which is the cathode of the third unit EL element 20c, are connected to each other via the wiring 34, the reverse bias is applied respectively to the third unit EL element 20c and the fourth unit EL element 20d that constitute the second series-connected part 25b having blacked out.

As described above, in this embodiment, while the first series-connected part 25a emits light, the reverse bias is applied respectively to the unit EL elements 20d and 20c in the second series-connected part 25b.

Then, when the current polarity of the power source unit 35 changes, the second series-connected part 25b previously having blacked out emits light, while the first series-connected part 25a previously having emitted light blacks out. At this time, the reverse bias is applied respectively to the unit EL elements 20a and 20b that constitute the first series-connected part 25a As described above, according to the organic EL devices 1 and 1', the series-connected parts 25a and 25b alternately emit light by an AC voltage without using a rectification circuit conventionally having been required.

The organic EL devices 1 and 1' of these embodiments of the present invention dispense with a rectification circuit, thereby ensuring miniaturization.

Now, a method for producing the organic EL device 1 and 1' will be described below, making reference to FIGS. 7A to 7F.

Figure 7A:
FIGS. 7A to 7F are conceptual diagrams showing a method for producing an organic EL device of an embodiment of the present invention, FIG. 7A showing a state in which a first electrode layer is laminated on a glass substrate, FIG. 7B showing a state in which first separation grooves are formed in the first electrode layer, FIG. 7C showing a state in which an organic emission layer is laminated on the first electrode layer, FIG. 7D showing a state in which emission-layer separation grooves are formed in the organic emission layer, FIG. 7E showing a state in which a second electrode layer is laminated on the organic emission layer, and FIG. 7F showing a state in which second separation grooves are formed in the second electrode layer.

Firstly, as shown in FIG. 7A, the front electrode layer 3 is laminated on the glass substrate 2.

Figure 7B:
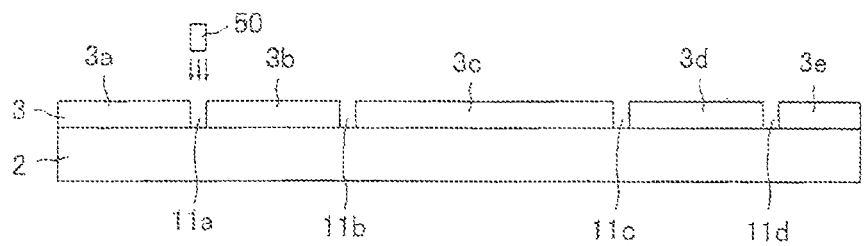

Then, as shown in FIG. 7B, the front electrode layer 3 is exposed to a laser beam by a laser equipment 50, whereby forming a plurality of the first separation grooves 11.

As a consequence, the front electrode layer 3 is divided into the front electrode pieces 3a to 3e. Herein, a distance between the first separation groove 11b and the first separation groove 11c, between which the second series-connected part 25b is located, is wider than distances between the other grooves, so that a width of the front electrode piece 3c constituting the second series-connected part 25b is larger than widths of the front electrode pieces 3a, 3b, and 3d.

The laser beam by the laser equipment 50 is a second harmonic (532 nm) of a YAG laser.

Figure 7C:
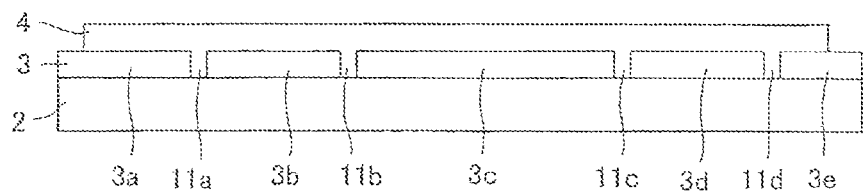

Subsequently, as shown in FIG. 7C, the organic emission layer 4 is deposited and laminated on the front electrode layer 3 by a method such as a vacuum deposition method.

Figure 7D:
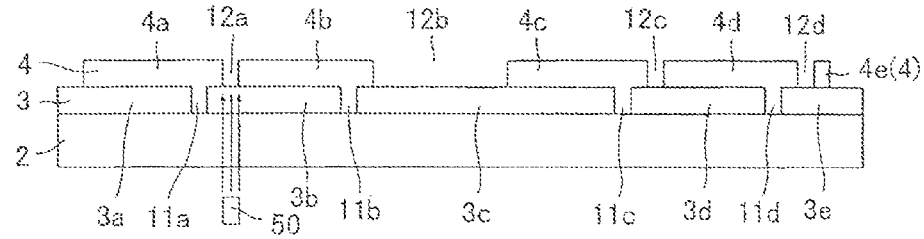

Then, as shown in FIG. 7D, the organic emission layer 4 is exposed to a laser beam from a side adjacent to the glass substrate 2 by the laser equipment 50, whereby forming a plurality of the emission-layer separation grooves 12. As a consequence, the organic emission layer 4 is divided into the small emitting areas 4a to 4e.

Herein, the emission-layer separation groove 12b located on the front electrode piece 3c has a groove width larger than the emission-layer separation grooves 12a, 12c, and 12d.

Figure 7E:
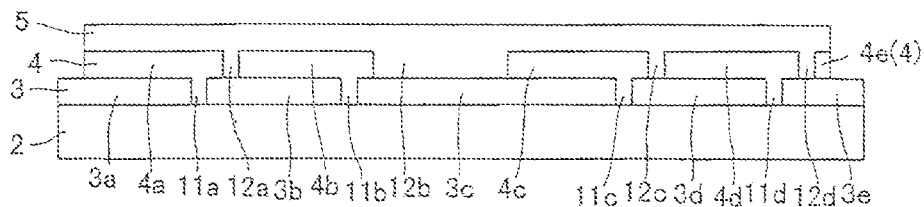

Subsequently, as shown in FIG. 7E, the back electrode layer 5 is laminated on the organic emission layer 4.

Figure 7F:
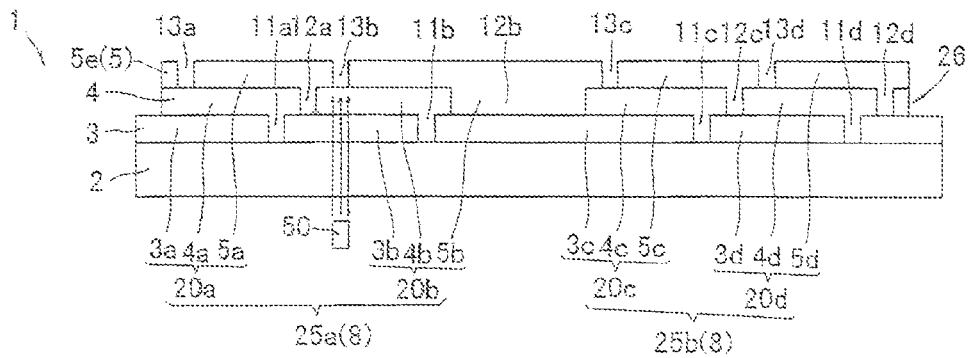

Then, as shown in FIG. 7F, the back electrode layer 5 is exposed to a laser beam from a side adjacent to the glass substrate 2 by the laser equipment 50, whereby forming a plurality of the second separation grooves 13. As a consequence, the back electrode layer 5 is divided into the back electrode pieces 5a to 5e.

Herein, a distance between the second separation groove 13b and the second separation groove 13c, between which the second unit EL element 20b is located, is wider than widths between the other grooves, so that a width of the back electrode piece 5b constituting the second unit EL element 20b is larger than those of the front electrode pieces 3a, 3b, and 3d.

As described above, after the steps in FIGS. 7A to 7F, the unit EL elements 20a to 20d and the series-connected parts 25a and 25b are formed on the glass substrate 2, which completes the organic-EL-element forming part 8 of the organic EL device 1. Without the internal wirings 31, 32, and 33, the series-connected parts 25a and 25b are connected in series and constitute the unit EL element row 26.

The producing method described above forms the series-connected parts 25a and 25b only by changing the spacing between laser beams, thereby eliminating masking of the base material.

Figure 8:
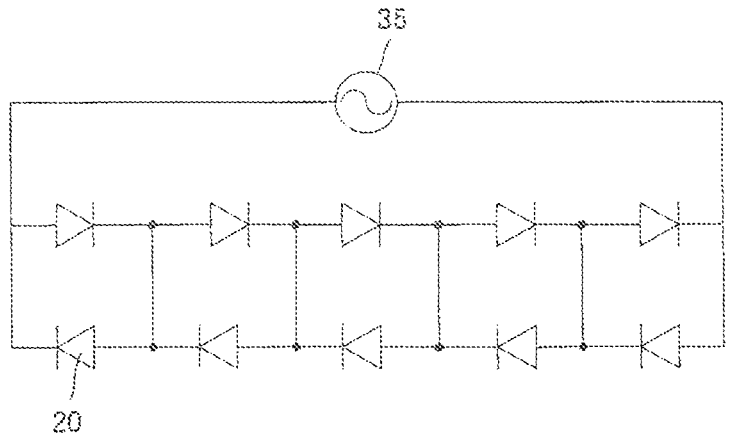
FIG. 8 is a bridge circuit, which is an equivalent circuit of an organic EL device of a further embodiment of the present invention.

These embodiments described above explain that the series-connected parts 25a and 25b respectively consist of two unit EL elements 20 that are connected in series, for simplification of the explanation, but actually consist of more unit EL elements 20 that are connected in series. Further, as shown in an equivalent circuit in FIG. 8, it is recommended that the unit EL elements 20 are electrically connected in a ladder fashion so as to constitute bridges.

In these embodiments described above, a plurality of the unit EL elements 20 are arranged in series and a power is supplied through both ends and the center thereof, so that the unit EL element row 26, in which a plurality of the unit EL elements 20 are apparently connected in series, is electrically divided into two rows of the series-connected parts 25a and 25b. However, the present invention is not limited to the electrical division of one row of the unit EL element row 26 into two rows of the series-connected parts 25a and 25b and may divide it into more.

Figure 9:
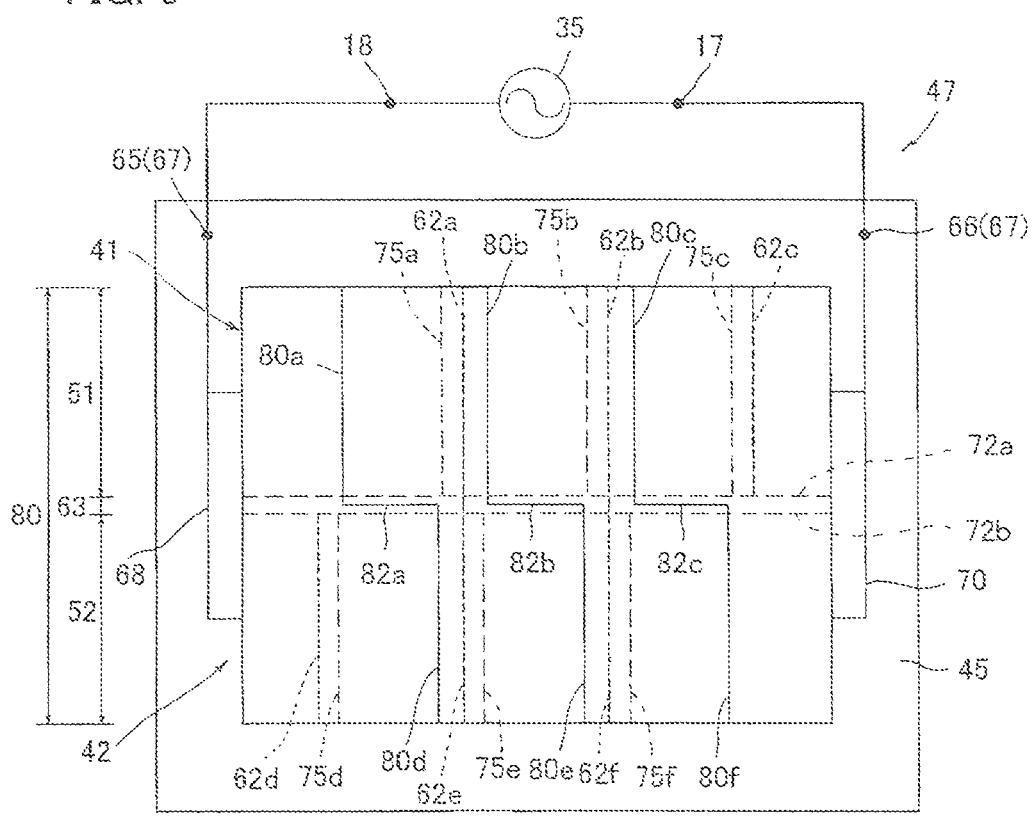
FIG. 9 is a plan view of an organic EL device of a further embodiment of the present invention, which is conceptually illustrated.
Figure 10:
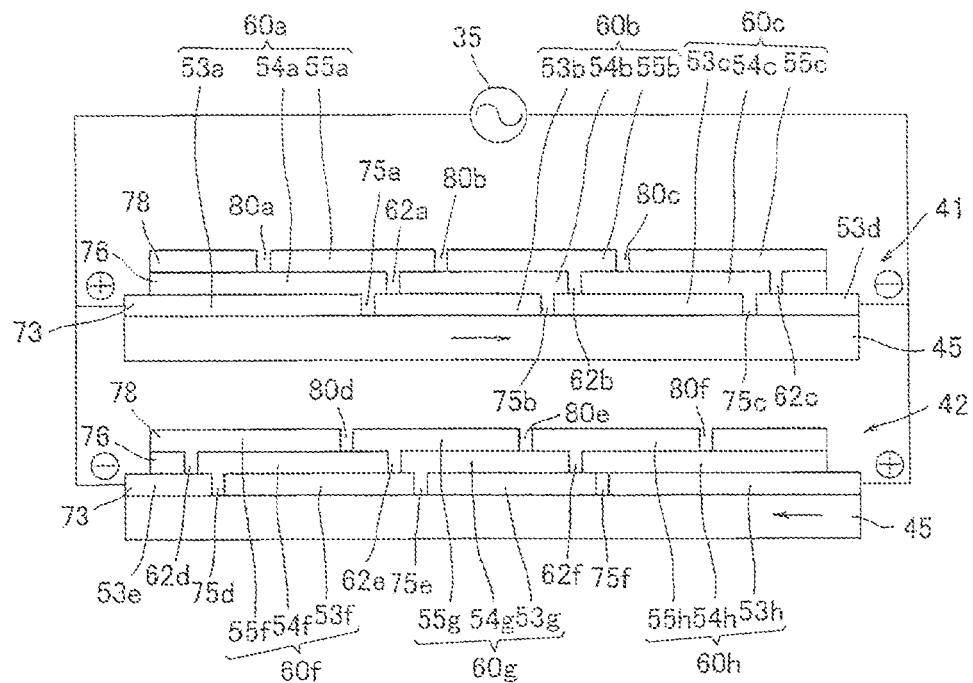
FIG. 10 is a front cross section of the organic EL device in FIG. 9.

Alternatively, as an organic EL device 47 shown in FIGS. 9 and 10, a plurality of rows of unit EL element rows 41 and 42 can be physically provided on a glass substrate (base material) 45, so as to function as series-connected parts and be simply connected in parallel. The organic EL device 47 of a below-mentioned embodiment is recommended in that each unit EL element 60 constitutes a bridge circuit with no internal wiring. Herein, in FIG. 9, each groove is expressed by one line with a width of the groove omitted for convenience of drawing figures.

The organic EL device 47 shown in FIGS. 9 and 10 is also constituted in such a manner that a power feeding part 67 and an organic-EL-element forming part 80 are formed on a glass substrate (base material) 45. Herein, the organic-EL-element forming part 80 is divided into two areas 51 and 52 across a buffer area 63. A unit EL element row (first series-connected part) 41 is formed in the area 51, while a unit EL element row (second series-connected part) 42 is formed in the area 52.

The buffer area 63 is, as shown in FIG. 9, an area defined by two buffer grooves 72a and 72b. The buffer grooves 72a and 72b each are a groove formed in a front electrode layer 73 (FIG. 10), which is the first electrode layer, and extending in a direction perpendicular to grooves such as below-mentioned first separation grooves 75.

In this embodiment, as shown in the plan view in FIG. 9, the two buffer grooves 72a and 72b divide the front electrode layer 73 in a planar manner, so that the front electrode layer 73 is separated between the two areas 51 and 52, which are non-conductive.

Further, in this embodiment, the unit EL element row (first series-connected part) 41 and the unit EL element row (second series-connected part) 42 formed in the two respective areas 51 and 52 have reversed polarities (eg., left to right, right to left, respectively), so as to have overall opposite polarities.

Similarly to the above-mentioned embodiments, in this embodiment, first separation grooves 75a to 75f are formed in the front electrode layer 73.

Further, emission-layer separation grooves 62a to 62f are formed in an organic emission layer 76. Further, second separation grooves 80a to 80f and connecting grooves 82a to 82c are formed in a back electrode layer 78, which is the second electrode layer.

In the organic EL device 47 of this embodiment, only two emission-layer separation grooves (62a and 62e, 62b and 62o located in the center among the grooves formed in the two areas 51 and 52 are linearly continuous and extend across the two areas 51 and 52.

Specifically, the emission-layer separation groove 62a and the emission-layer separation groove 62e are connected with each other in a linear fashion. The emission-layer separation groove 62b and the emission-layer separation groove 62f are connected with each other in a linear fashion.

In contrast, the area 51 has another emission-layer separation groove 62c located at the right in the figure, while the area 52 has another emission-layer separation groove 62d located at the left in the figure.

The first separation grooves 75a to 75f are discontinuous between the two areas 51 and 52. Specifically, the area 51 located in the upper portion in the figure has the first separation groove 75a on the left side of the emission-layer separation groove 62a located on the left side of the center, while the area 52 located in the lower portion in the figure has the first separation groove 75e on the right side of the emission-layer separation groove 62e located on the left side of the center. Similarly, the area 51 located in the upper portion in the figure has the first separation groove 75b on the left side of the emission-layer separation groove 62b located on the right side of the center, while the area 52 located in the lower portion in the figure has the first separation groove 75f on the right side of the emission-layer separation groove 62f located on the right side of the center.

Further, the area 51 has the first separation groove 75c located at the right in the figure, while the area 52 has the first separation groove 75d located at the left in the figure.

The second separation grooves 80a to 80f are also discontinuous between the two areas 51 and 52. Specifically, the area 51 located in the upper portion in the figure has the second separation groove 80b on the right side of the emission-layer separation groove 62a located on the left side of the center, while the area 52 located in the lower portion in the figure has the second separation groove 80d on the left side of the emission-layer separation groove 62e located on the left side of the center.

Similarly, the area 51 located in the upper portion in the figure has the second separation groove 80c on the right side of the emission-layer separation groove 62b located on the right side of the center, while the area 52 located in the lower portion in the figure has the second separation groove 80e on the left side of the emission-layer separation groove 62f located on the right side of the center.

Further, the area 51 has the second separation groove 80a located at the left in the figure, while the area 52 has the second separation groove 80f located at the right in the figure.

However, this embodiment is provided with the connecting groove 82a between the second separation groove 80a in the area 51 located in the upper portion in the figure and the second separation groove 80d in the area 52 located in the lower portion in the figure.

Similarly, there is provided the connecting groove 82b between the second separation groove 80b in the area 51 located in the upper portion in the figure and the second separation groove 80e in the area 52 located in the lower portion in the figure.

Further, there is provided the connecting groove 82c between the second separation groove 80c in the area 51 located in the upper portion in the figure and the second separation groove 80f in the area 52 located in the lower portion in the figure.

The two unit EL element rows (series-connected parts) 41 and 42 each consist of three unit EL elements 60. Specifically, the unit EL element row (first series-connected part) 41 has a first unit EL element 60a, a second unit EL element 60b, and a third unit EL element 60c from the left in the figure (FIG. 10), each of which has a front electrode piece 53, a small emitting area 54, and a back electrode piece 55. More specifically, the first unit EL element 60a is constituted by a front electrode piece 53a, a small emitting area 54a, and a back electrode piece 55a.

Similarly, the second unit EL element 60b is constituted by a front electrode piece 53b, a small emitting area 54b, and a back electrode piece 55b. Similarly, the third unit EL element 60c is constituted by a front electrode piece 53c, the small emitting area 54c, and a back electrode piece 55c.

Herein, the back electrode piece 55a of the first unit EL element 60a is electrically connected to the front electrode piece 53b of the second unit EL element 60b via a part of the back electrode piece 55a that penetrates in the emission-layer separation groove 62a. Similarly, the back electrode piece 55b of the second unit EL element 60b is electrically connected to the front electrode piece 53c of the third unit EL element 60c via a part of the back electrode piece 55b that penetrates in the emission-layer separation groove 62b. Similarly, the back electrode piece 55c of the third unit EL element 60c is electrically connected to the front electrode piece 53d located at a distal end via a part of the back electrode piece 55c that penetrates in the emission-layer separation groove 62c. Consequently, the first unit EL element 60a, the second unit EL element 60b, and the third unit EL element 60c are electrically connected in series.

Herein, in the unit EL element row (first series-connected part) 41, a direction of the electric current flowing from the front electrode piece 53a of the first unit EL element 60a to the front electrode piece 53d located at the distal end is a forward direction. In sum, in the unit EL element row 41, the direction of the electric current flowing from the left to the right in the figure as shown by an arrow in FIG. 10 is the forward direction.

In contrast, the unit EL element row (second series-connected part) 42 has a reverse polarity.

Specifically, the unit EL element row 42 has a reverse polarity (right to left) relative to the above-mentioned unit EL element row 41, so as to have a front electrode piece 53e, which is located at a distal end of the front electrode layer, at the left end in the figure.

The unit EL element row (second series-connected part) 42 also has a fourth unit EL element 60f, a fifth unit EL element 60g, and a sixth unit EL element 60h from the left in the figure, each of which has the front electrode piece 53, the small emitting area 54, and the back electrode piece 55. More specifically, the fourth unit EL element 60f is constituted by a front electrode piece 53f, a small emitting area 54f, and a back electrode piece 55f.

Similarly, the fifth unit EL element 60g is constituted by a front electrode piece 53g, a small emitting area 54g, and a back electrode piece 55g.

Similarly, the sixth unit EL element 60h is constituted by a front electrode piece 53h, a small emitting area 54h, and a back electrode piece 55h.

However, in the unit EL element row (second series-connected part) 42, the unit EL elements 60f to 60h are connected reversely with the unit EL elements in the unit EL element row (first series-connected part) 41, so that the front electrode piece 53e located at the left end in the figure is connected to the back electrode piece 55f of the fourth unit EL element 60f via the emission-layer separation groove 62d.

Similarly, the front electrode piece 53f, which is the anode of the fourth unit EL element 60f, is connected to the back electrode piece 55g of the fifth unit EL element 60g via the emission-layer separation groove 62e.

Similarly, the front electrode piece 53g, which is the anode of the fifth unit EL element 60g, is connected to the back electrode piece 55h of the sixth unit EL element 60h via the emission-layer separation groove 62f.

In this way, the unit EL element row 42 has the connection via the emission-layer separation grooves 62 reversely with that in the unit EL element row 41, so that a direction of the electric current flowing from the right side to the left side in the figure as shown by an arrow in FIG. 10 is a forward direction.

Figure 11:
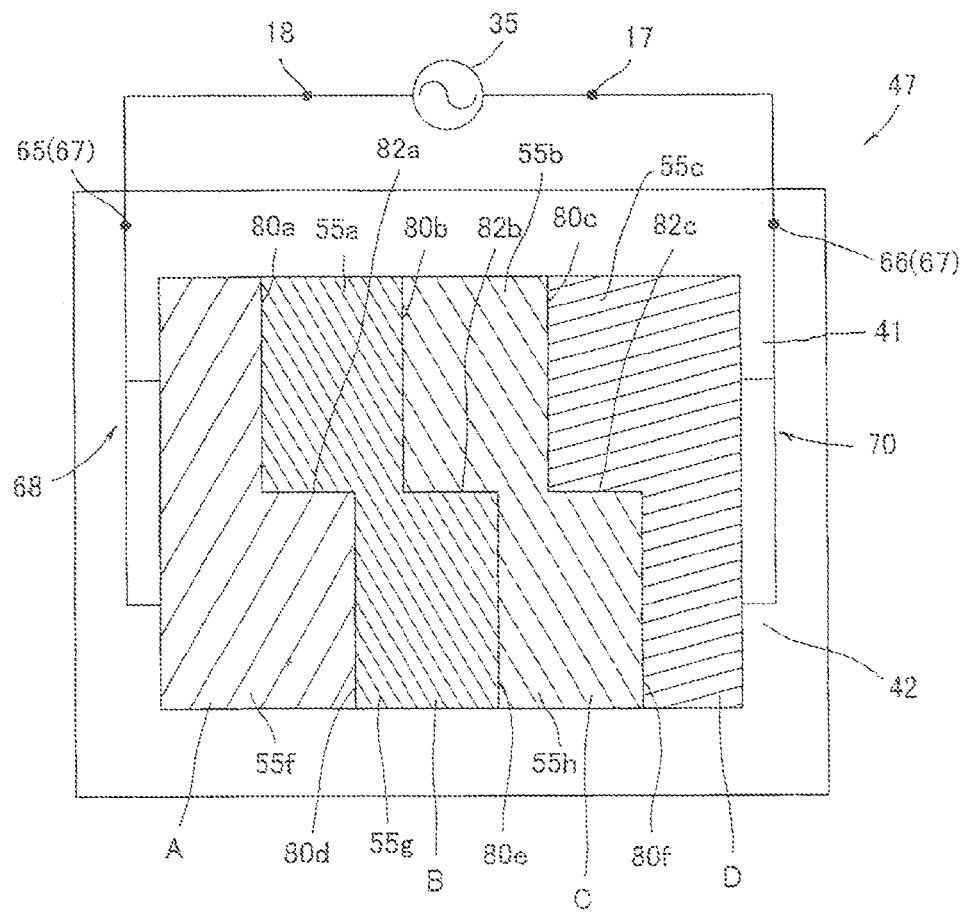
FIG. 11 is a plan view showing a second electrode layer of the organic EL device in FIG. 9, in which areas divided by grooves are illustrated.

In terms of the back electrode layer 78 of the organic EL device 47, the back electrode layer 78, as described above, has the second separation grooves 80a to 80f and the connecting grooves 82a to 82c, so that a flat surface of the back electrode layer 78 is divided into four areas A, B, C, and D as shown in FIG. 11.

Specifically, the area A is defined by an outer line and a line consisting of the second separation groove 80a, the connecting groove 82a, and the second separation groove 80d.

Similarly, the area B is defined by the line consisting of the second separation groove 80a, the connecting groove 82a, and the second separation groove 80d and a line consisting of the second separation groove 80b, the connecting groove 82b, and the second separation groove 80e.

Similarly, the area C is defined by the line consisting of the second separation groove 80b, the connecting groove 82b, and the second separation groove 80e and a line consisting of the second separation groove 80c, the connecting groove 82c, and the second separation groove 80f.

Similarly, the area D is defined by the line consisting of the second separation groove 80c, the connecting groove 82c, and the second separation groove 80f and an outer line.

Thereby, the back electrode piece 55a of the first unit EL element 60a and the back electrode piece 55g of the fifth unit EL element 60g are situated in the same area B and electrically connected to each other.

Thus, the back electrode piece 55a, which is the cathode of the first unit EL element 60a, is connected to the back electrode piece 55g, which is the cathode of the fifth unit EL element 60g, in the back electrode layer 78 in the area B.

Similarly, the back electrode piece 55b of the second unit EL element 60b and the back electrode piece 55h of the sixth unit EL element 60h are situated in the same area C and electrically connected to each other.

Thus, the back electrode piece 55b, which is the cathode of the second unit EL element 60b, is connected to the back electrode piece 55h, which is the cathode of the sixth unit EL element 60h, in the back electrode layer 78 in the area C.

The glass substrate (base material) 45 is provided with power feeding terminals 65 and 66, which constitute the power feeding part 67.

In this embodiment, the power feeding terminals 65 and 66 are connected to the front electrode pieces 53a, 53d, 53e, and 53h that are located at both ends of the respective unit EL element rows 41 and 42 via internal wirings 68 and 70.

Figure 12:
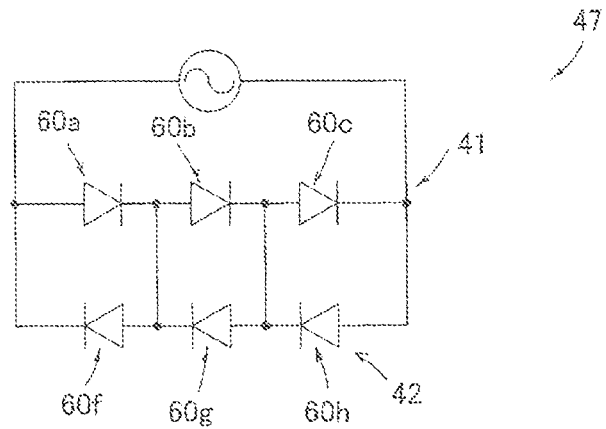
FIG. 12 is an electrical diagram showing the organic EL device in FIG. 9.

The equivalent circuit of the organic EL device 47 of this embodiment is shown in FIG. 12.

While the first unit EL element row 41 emits light, a reverse bias is applied to the unit EL elements 60f, 60g, and 60h of the second unit EL element row 42, respectively.

When the power source unit 35 changes in polarity, the second unit EL element row 42 that has previously blacked out emits light and the first unit EL element row 41 that has emitted light blacks out. At this time, a reverse bias is applied to the unit EL elements 60a, 60b, and 60c constituting the first unit EL element row 41, respectively.

Also in the organic EL device 47 of the present embodiment, the two unit EL element rows are formed only by changing the spacing between laser beams.

However, since the glass substrate (base material) 45 is divided into the two areas 51 and 52, it is necessary to provide the buffer area 63 between the areas 51 and 52.

Provision of the buffer area 63 facilitates formation of the grooves by the laser beam. Specifically, in the organic EL device 47 of the present embodiment, the grooves are different in position at the two areas 51 and 52. Thus, the grooves cannot be formed over both ends of the glass substrate (base material) 45.

Though the glass substrate (base material) 45 must make a rectilinear movement relative to the laser equipment with generating the laser beam when the grooves are formed in each layer using the laser beam, it is difficult to stop the laser beam irradiation in the middle of the groove formation. In other words, in order to form the grooves by the laser beam, the grooves must be formed from an end to the other end of a given area. Herein, with the buffer area 63 lying between the two areas 51 and 52, the grooves are formed in an area from the end of the glass substrate (base material) 45 up to the buffer area 63 and the laser beam irradiation can be stopped at the buffer area 63.

Alternatively, in addition to a means to provide the buffer area 63 or instead of the means to provide the buffer area 63, a method of covering the other area than a given area with an opaque member during formation of the grooves in the given area is also effective.

During formation of the grooves in the area 51, for example, the other area 52 is covered with an opaque board in between the laser equipment. That protects the area 52 from formation of grooves even if the laser beam reaches the area 52, since the board intercepts the laser beam.

Therefore, the groove formation by using a laser beam forms a plurality of unit EL element rows.

In the embodiment illustrated in FIGS. 11 and 12, the second separation grooves 80a to 80f formed in the unit EL element rows 41 and 42 are straight lines that are formed at shifted positions relatively to each other.

Specifically, the second separation groove 80a formed in the unit EL element row 41 and the second separation groove 80d formed in the unit EL element row 42 are located at shifted positions and connected to each other via the connecting groove 82a.

In the embodiment illustrated in FIGS. 11 and 12, as shown in the equivalent circuit in FIG. 12, the back electrode piece 55a, which is an N side of the unit EL element 60a functioning as a PN junction in the unit EL element row 41, is connected to the back electrode piece 55g, which is an N side of the unit EL element 60g functioning as a PN junction in the unit EL element row 42, in the back electrode layer 78 in the area B. Similarly, the back electrode piece 55b, which is an N side of the unit EL element 60b functioning as a PN junction in the unit EL element row 41 is connected to the back electrode piece 55h, which is an N side of the unit EL element 60h functioning as a PN junction in the unit EL element row 42, in the back electrode layer 78 in the area C.

Figure 13:
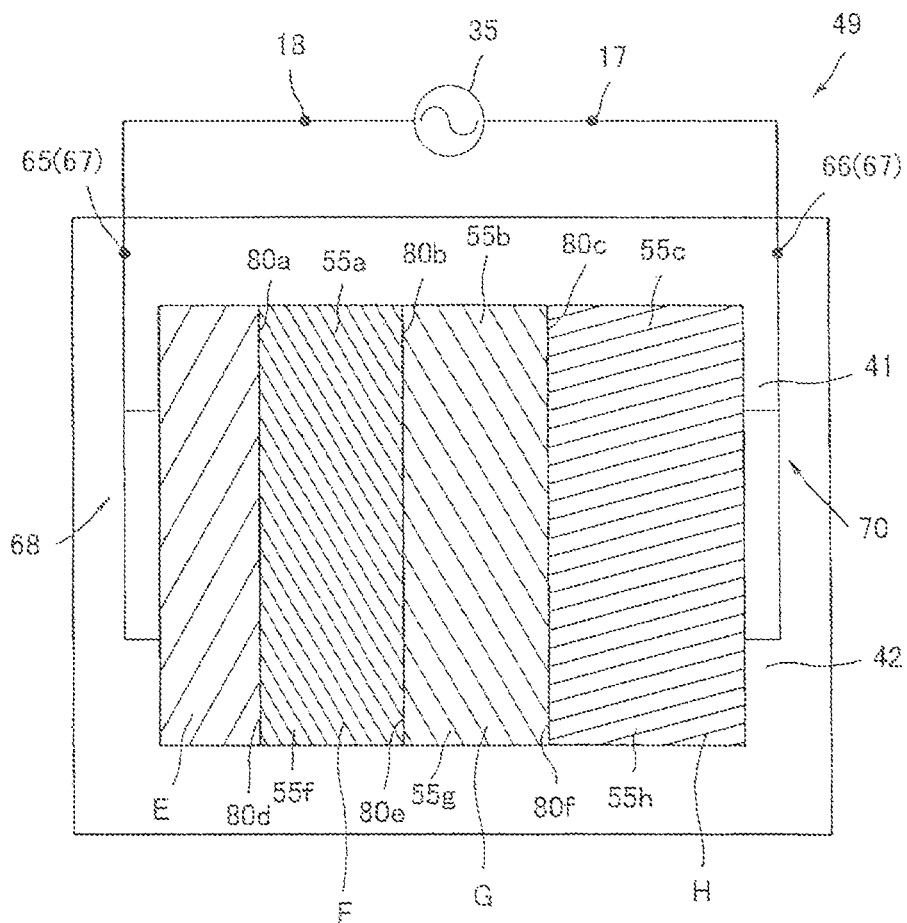
FIG. 13 is a plan view showing a second electrode layer of an organic EL device of a further embodiment of the present invention, in which areas divided by grooves are illustrated.

However, the present invention is not limited to such a configuration in which there is provided members such as the second separation grooves 80a to 80f like a polygonal line and may have a configuration in which the second separation grooves 80a to 80f provided in the unit EL element rows 41 and 42 are linearly connected to each other as shown in FIG. 13.

In an embodiment shown in FIG. 13, a flat surface of the back electrode layer 78 is divided into four areas E, F, G, and H by the second separation grooves 80a to 80f as shown in FIG. 13.

Figure 14:
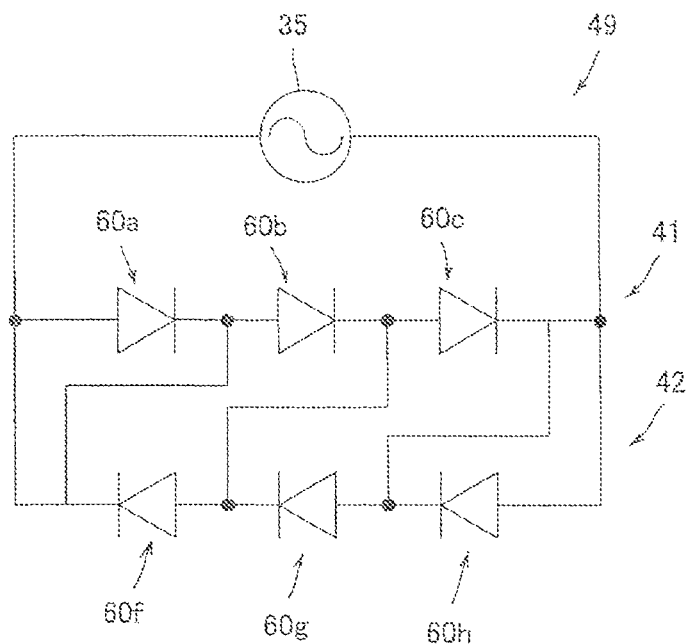
FIG. 14 is an electrical diagram showing the organic EL device in FIG. 13.

An equivalent circuit of an organic EL device 49 of the present embodiment is shown in FIG. 14.

In the organic EL device 49 of this embodiment, as shown in the equivalent circuit in FIG. 14, the back electrode piece 55a, which is an N side of the unit EL element 60a functioning as a PN junction in the unit EL element row 41, is connected to the back electrode piece 55f, which is an N side of the unit EL element 60*f* functioning as a PN junction in the unit EL element row 42, in the back electrode layer 78 in the area F. Similarly, the back electrode piece 55*b*, which is an N side of the unit EL element 60*b* functioning as a PN junction in the unit EL element row 41, is connected to the back electrode piece 55*g*, which is an N side of the unit EL element 60*g* functioning as a PN junction in the unit EL element row 42, in the back electrode layer 78 in the area G.

Further, the back electrode piece 55*c*, which is an N side of the unit EL element 60*c* functioning as a PN junction in the unit EL element row 41, is connected to the back electrode piece 55*h*, which is an N side of the unit EL element 60*h* functioning as a PN junction in the unit EL element row 42, in the back electrode layer 78 in the area H.

In this way, also in the organic EL device 49 of the present embodiment, the unit EL elements 60 constitute a bridge circuit, so that a reverse bias is applied to the unit EL elements 60 constituting the series-connected part (unit EL element row 41 or 42) that has blacked out.

Here are described the configuration in which the unit EL element row 26 constituted by an plurality of the unit EL elements 20 apparently connected in series is electrically divided into two rows of the series-connected parts 25*a* and 25*b* as the first embodiment as shown in FIGS. 1 and 2 and the configuration in which the unit EL element rows 41 and 42 directly function as the series-connected parts as the second embodiment as shown in FIGS. 9 and 10.

Figure 15:
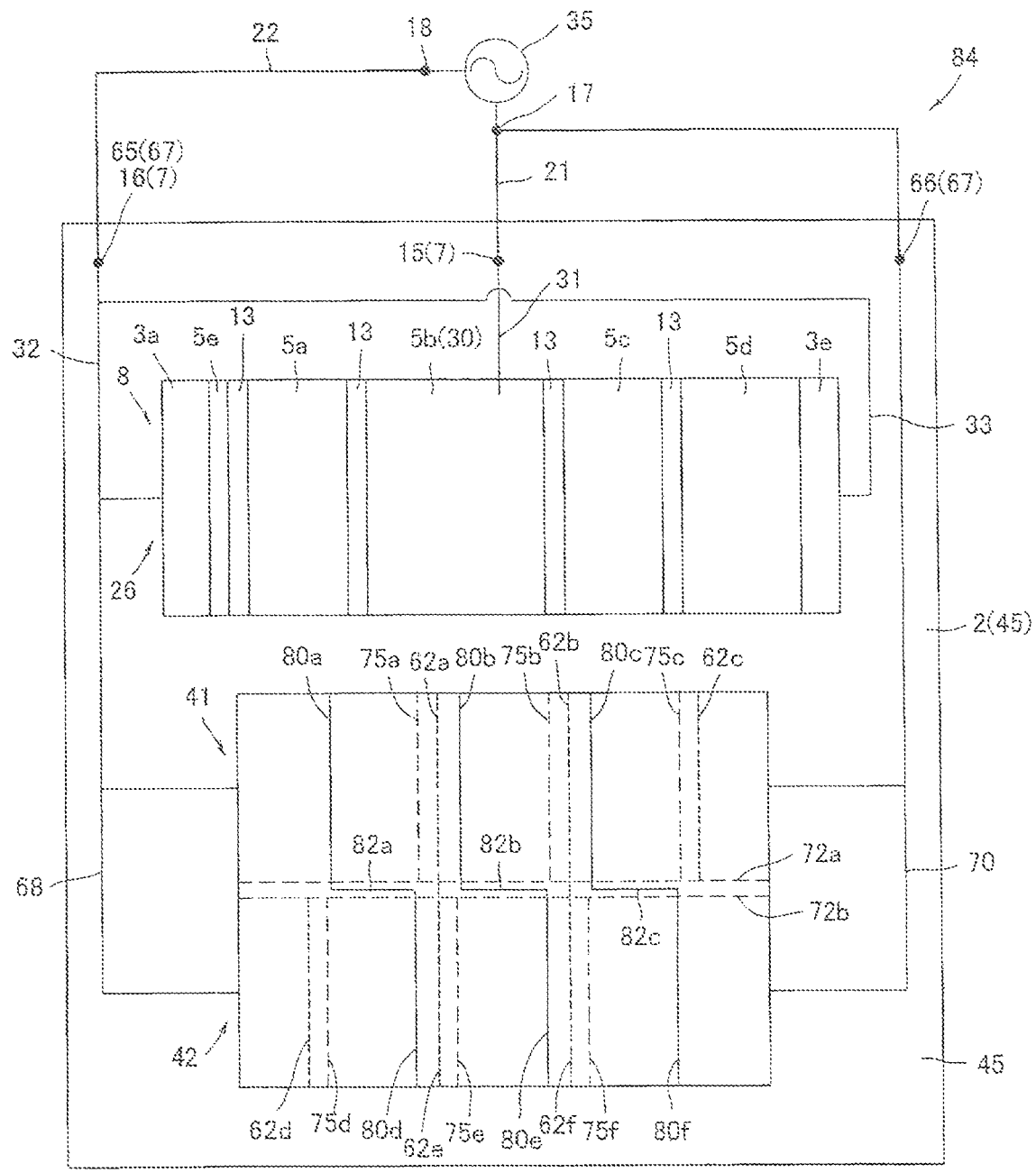
FIG. 15 is a plan view of an organic EL device of a further embodiment of the present invention, which is conceptually illustrated.

However, the present invention is not limited to one provided with just one of the configurations in the foregoing embodiments and may have a configuration in which there are provided both a part that forms the series-connected parts 25*a* and 25*b* by electrically dividing the unit EL element row 26 and a part that makes the unit EL element rows 41 and 42 directly function as the series-connected parts. FIG. 15 illustrates an example of this configuration. The same numerals are provided to the same members so that the duplicated description is omitted because an organic EL device 84 of this embodiment has the same configuration of each member as that of the foregoing embodiments.

The invention claimed is:

1. An organic EL device comprising a power feeding part and an organic-EL-element forming part,
   wherein the organic-EL-element forming part includes a plurality of unit EL elements formed on a substrate, and
   wherein the organic-EL-element forming part is constituted by a plurality of series-connected parts each formed by a plurality of the unit EL elements that are electrically connected in series in a forward direction,
   the series-connected parts being electrically connected to the power feeding part in parallel,
   each of the plurality of series-connected parts including a corresponding reverse polarity series-connected part that is connected to the power feeding part so as to have reverse polarity as compared to the other of the series-connected parts,
   wherein end portions of the series-connected parts, which are electrically divided in a unit EL element row, are electrically connected to each other by a layer of organic EL elements,
   wherein the unit EL element row is electrically divided by a plurality of the serially connected unit EL elements receiving electric power through the central portion and through both end portions,
   wherein the central portion is a series-connected part that is not an end portion, and
   wherein each series-connected part receives power from the layer of organic EL elements.

2. The organic EL device as defined in claim 1, having a unit EL element row formed by a plurality of the unit EL elements that are apparently connected in series,
   the unit EL element row being divided into a plurality of the series-connected parts, and
   the series-connected parts being electrically connected to the power feeding part in parallel.

3. The organic EL device as defined in claim 2,
   the unit EL element row receiving electric power through a center of the unit EL element row and through both sides of the unit EL element row.

4. The organic EL device as defined in claim 1, having a plurality of unit EL element rows each formed by a plurality of the unit EL elements that are apparently connected in series,
   each of the unit EL element rows functioning as a single series-connected part and being electrically connected to the power feeding part in parallel.

5. The organic EL device as defined in claim 1, having a plurality of unit EL element rows each formed by a plurality of the unit EL elements that are apparently connected in series,
   the unit EL element rows including at least one row that is divided into a plurality of the series-connected parts,
   the unit EL element rows further including at least another row that forms a single series-connected part, and
   the series-connected parts each being electrically connected to the power feeding part in parallel.

6. The organic EL device as defined in claim 1
   a unit EL element belonging to one of the series-connected parts and another unit EL element belonging to another of the series-connected parts being connected in parallel, so as to form a bridge circuit.

7. The organic EL device as defined in claim 1,
   the unit EL elements each having a part functioning as an anode and a part functioning as a cathode, and
   at least one pair selected from the group consisting of (1) a pair of the parts that function as the anodes and (2) a pair of the parts that function as the cathodes being electrically connected to each other between a unit EL element belonging to one of the series-connected parts and another unit EL element belonging to another of the series-connected parts.

8. The organic EL device as defined in claim 1, including at least a first electrode layer, an organic emission layer, and a second electrode layer that are laminated on the substrate, and
   further having first separation grooves dividing the first electrode layer into a plurality of small pieces, emission-layer separation grooves dividing the organic emission layer into a plurality of small emitting areas, and second separation grooves dividing the second electrode layer into a plurality of small pieces,
   so that the unit EL elements each are constituted by one of the small pieces of the first electrode layer, one of the small emitting areas, and one of the small pieces of the second electrode layer.

9. The organic EL device as defined in claim 8,
   a part of the small piece of the second electrode layer belonging to at least one of the unit EL elements extending and being connected to the small piece of the first electrode layer belonging to another of the unit EL elements.

10. The organic EL device as defined in claim 8,
    wherein the series-connected part is constituted by electrically and sequentially connecting adjacent unit EL elements in series in a forward direction in such a manner that a part of the small piece of the second electrode layer belonging to a unit EL element extends to the small piece of the first electrode layer belonging to its adjacent EL element, a plurality of the series-connected parts being arranged on the substrate in parallel, the adjacent series-connected parts having opposing electrical forward directions to the substrate in a planar view of the substrate, each of the small pieces of the second electrode layer belonging to the unit EL elements of series-connected parts being continuous with another small piece of the second electrode layer belonging to the unit EL elements of series-connected parts, and the small pieces of the second electrodes belonging to the unit EL elements of adjacent series-connected parts being electrically connected to each other.

11. The organic EL device as defined in claim 8, including at least two rows of the first electrode layer formed on the substrate and electrically insulated from each other, the organic emission layer and the second electrode layer are laminated on each row of the first electrode layer, wherein each row of the first electrode layer is divided into a plurality of small pieces by the first separation grooves, the organic emission layer is divided into a plurality of small emitting areas by the emission-layer separation grooves, and the second electrode layer is divided into a plurality of small pieces by the second separation grooves, the small pieces of the second electrode layer being electrically connected to the small pieces of the second electrode layer that is laminated on the first electrode layer belonging to the adjacent row.

12. The organic EL device as defined in claim 8, the second electrode layer being laminated on an area that bridges over more than one row of the first electrode layer, over which the second separation grooves extend, so that the second separation grooves divide the second electrode layer into a plurality of divided areas, and each of the divided areas including the single small piece of the second electrode layer that includes the first electrode layer belonging to one row and the single small piece of the second electrode layer that includes the first electrode layer belonging to its adjacent row.

13. The organic EL device as defined in claim 12, the second separation grooves each being constituted by straight lines located at shifted positions and a line connecting the straight lines.

14. A method for producing an organic EL device, comprising a step of forming the first separation grooves, the emission-layer grooves, and the second separation grooves by irradiation of a laser beam in the organic EL device as defined in claim 8.

15. An organic EL device comprising a power feeding part and an organic-EL-element forming part, wherein the organic-EL-element forming part includes a plurality of unit EL elements formed on a substrate, wherein the organic-EL-element forming part is constituted by a plurality of series-connected parts each formed by a plurality of the unit EL elements that are electrically connected in series in a forward direction, the series-connected parts being electrically connected to the power feeding part in parallel, the series-connected parts including a series-connected part that is connected to the power feeding part so as to have a reverse polarity, the organic EL device including at least a first electrode layer, an organic emission layer, and a second electrode layer that are laminated on the substrate, further having first separation grooves dividing the first electrode layer into a plurality of small pieces, emission-layer separation grooves dividing the organic emission layer into a plurality of small emitting areas, and second separation grooves dividing the second electrode layer into a plurality of small pieces, so that the unit EL elements each are constituted by one of the small pieces of the first electrode layer, one of the small emitting areas, and one of the small pieces of the second electrode layer, wherein the series-connected part is constituted by electrically and sequentially connecting adjacent unit EL elements in series in a forward direction in such a manner that a part of the small piece of the second electrode layer belonging to a unit EL element extends to the small piece of the first electrode layer belonging to its adjacent EL element, a plurality of the series-connected parts being arranged on the substrate in parallel, the adjacent series-connected parts having opposing electrical forward directions to the substrate in a planar view of the substrate, each of the small pieces of the second electrode layer belonging to the unit EL elements of adjacent series-connected parts being continuous with another small piece of the second electrode layer belonging to the unit EL elements of series-connected parts, and the small pieces of the second electrodes belonging to the unit EL elements of adjacent series-connected parts being electrically connected to each other.

* * * * *